(12) United States Patent
Tsai et al.

(10) Patent No.: US 11,664,206 B2
(45) Date of Patent: May 30, 2023

(54) ARCING PROTECTION METHOD AND PROCESSING TOOL

(71) Applicant: Taiwan Semiconductor Manufacturing Co., Ltd., Hsinchu (TW)

(72) Inventors: Wun-Kai Tsai, Huwei Township, Yunlin County (TW); Wen-Che Liang, Taichung (TW); Chao-Keng Li, Jhubei (TW); Zheng-Jie Xu, Taichung (TW); Chih-Kuo Chang, Baoshan Township, Hsinchu County (TW); Sing-Tsung Li, Taichung (TW); Feng-Kuang Wu, Hsinchu County (TW); Hsu-Shui Liu, Pingjhen (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 231 days.

(21) Appl. No.: 15/901,970

(22) Filed: Feb. 22, 2018

(65) Prior Publication Data
US 2019/0139746 A1 May 9, 2019

Related U.S. Application Data

(60) Provisional application No. 62/583,062, filed on Nov. 8, 2017.

(51) Int. Cl.
*H01J 37/32* (2006.01)
*H01J 37/244* (2006.01)
(Continued)

(52) U.S. Cl.
CPC ...... *H01J 37/32926* (2013.01); *C23C 16/505* (2013.01); *G05B 19/4065* (2013.01);
(Continued)

(58) Field of Classification Search
CPC .............. H01J 37/32926; H01J 37/244; H01J 37/32183; H01J 2237/334;
(Continued)

(56) References Cited

U.S. PATENT DOCUMENTS

| | | | | |
|---|---|---|---|---|
| 4,166,783 A | * | 9/1979 | Turner | C23C 14/3407 204/192.13 |
| 4,926,116 A | * | 5/1990 | Talisa | G01R 15/20 324/117 H |

(Continued)

FOREIGN PATENT DOCUMENTS

| | | | | |
|---|---|---|---|---|
| CN | 102981028 | * | 3/2013 | ............... G01R 1/06 |
| JP | 2010037643 | * | 2/2010 | ............. C23C 16/52 |
| WO | WO2013018776 | * | 2/2013 | ......... H01L 21/3065 |

OTHER PUBLICATIONS

Killner et al "Increasing the detection distance of remote NMR using wireless inductive coupling coil" Oct. 2017, pp. 1-6, downloaded from the internet https://www.nature.com/articles/s41598-017-12854-x#citeas (Year: 2017).*

(Continued)

*Primary Examiner* — Rocio Del Mar Perez-Velez
*Assistant Examiner* — Olvin Lopez Alvarez
(74) *Attorney, Agent, or Firm* — McClure, Qualey & Rodack, LLP

(57) ABSTRACT

A fabrication system for fabricating an IC is provided which includes a processing tool, a computation device and a FDC system. The processing tool includes an electrode and an RF sensor to execute a semiconductor manufacturing process to fabricate the IC. The RF sensor wirelessly detects the intensity of the RF signal. The computation device extracts statistical characteristics based on the detection of the intensity of the RF signal. The FDC system determines whether or not the intensity of the RF signal meets a threshold value or a threshold range according to the extracted statistical (Continued)

characteristics. When the detected intensity of the RF signal exceeds the threshold value or the threshold range, the FDC system notifies the processing tool to adjust the RF signal or stop tool to check parts damage.

20 Claims, 6 Drawing Sheets

(51) Int. Cl.
  H01L 21/66    (2006.01)
  H01L 21/67    (2006.01)
  G05B 19/4065  (2006.01)
  C23C 16/505   (2006.01)

(52) U.S. Cl.
  CPC ...... H01J 37/244 (2013.01); H01J 37/32183 (2013.01); H01L 21/67069 (2013.01); H01L 21/67253 (2013.01); H01L 22/20 (2013.01); G05B 2219/45031 (2013.01); H01J 2237/334 (2013.01); H01J 2237/3321 (2013.01)

(58) Field of Classification Search
  CPC ........... H01J 2237/3321; H01J 37/3299; H01J 37/32944; C23C 16/505; C23C 16/52; C23C 16/509; G05B 19/4065; G05B 2219/45031; H01L 21/67253; H01L 22/20; H01L 21/67069
  See application file for complete search history.

(56) References Cited

U.S. PATENT DOCUMENTS

| | | | | | |
|---|---|---|---|---|---|
| 5,067,099 | A | * | 11/1991 | McCown | G06F 11/2257 702/183 |
| 5,408,171 | A | * | 4/1995 | Eitzmann | G05F 1/16 323/258 |
| 5,584,972 | A | * | 12/1996 | Lantsman | H01J 37/34 204/192.12 |
| 6,030,881 | A | * | 2/2000 | Papasouliotis | C23C 16/045 257/E21.546 |
| 6,778,873 | B1 | * | 8/2004 | Wang | G05B 19/4184 700/109 |
| 7,558,687 | B1 | * | 7/2009 | Bode | G05B 21/02 700/14 |
| 9,412,566 | B2 | * | 8/2016 | Me | H01J 37/32834 |
| 9,953,888 | B1 | * | 4/2018 | Fang | H01J 37/32091 |
| 10,108,522 | B1 | * | 10/2018 | Jain | G06F 11/3409 |
| 10,170,287 | B1 | * | 1/2019 | Wu | H01J 37/32183 |
| 2002/0108933 | A1 | * | 8/2002 | Hoffman | H01J 37/32082 219/121.43 |
| 2003/0034244 | A1 | * | 2/2003 | Yasar | H01L 21/2855 204/192.3 |
| 2004/0044435 | A1 | * | 3/2004 | Hellig | G05B 19/41865 700/214 |
| 2004/0130318 | A1 | * | 7/2004 | Saltsov | G01D 5/204 324/207.17 |
| 2008/0040061 | A1 | * | 2/2008 | Osada | H01J 37/32935 702/82 |
| 2008/0142346 | A1 | * | 6/2008 | Zapf | H03K 17/9525 200/61.88 |
| 2009/0159439 | A1 | * | 6/2009 | Pipitone | H01J 37/321 204/298.03 |
| 2009/0294061 | A1 | * | 12/2009 | Shannon | H01J 37/32183 118/723 MP |
| 2009/0294275 | A1 | * | 12/2009 | Shannon | H01L 21/67253 204/164 |
| 2009/0309579 | A1 | * | 12/2009 | Cochran | A61B 5/1126 324/207.16 |
| 2009/0322326 | A1 | * | 12/2009 | Ito | G01R 15/181 324/263 |
| 2011/0137446 | A1 | * | 6/2011 | Valcore, Jr. | H01J 37/3299 700/108 |
| 2012/0074929 | A1 | * | 3/2012 | Wobschall | G01R 15/181 324/126 |
| 2012/0074951 | A1 | * | 3/2012 | Chen | H01J 37/32183 324/509 |
| 2014/0073143 | A1 | * | 3/2014 | Alokozai | C23C 16/45563 438/765 |
| 2014/0303769 | A1 | * | 10/2014 | Koyama | G05B 23/0264 700/121 |
| 2015/0048862 | A1 | * | 2/2015 | Na | G01R 31/245 324/555 |
| 2015/0069912 | A1 | * | 3/2015 | Valcore, Jr. | H03J 7/00 315/111.21 |
| 2015/0088441 | A1 | * | 3/2015 | Nakata | G01R 21/1331 702/61 |
| 2015/0212140 | A1 | * | 7/2015 | Lawrence | G01R 31/50 324/509 |
| 2015/0221484 | A1 | * | 8/2015 | Iliopoulos | H01J 37/32174 118/697 |
| 2017/0084432 | A1 | * | 3/2017 | Valcore, Jr. | H01J 37/32146 |
| 2017/0169995 | A1 | * | 6/2017 | Kim | H01J 37/32009 |
| 2017/0197087 | A1 | * | 7/2017 | Hong | A61N 2/006 |
| 2017/0244500 | A1 | * | 8/2017 | Wilson | H04B 17/0085 |
| 2017/0269239 | A1 | * | 9/2017 | Kamieniecki | G01T 3/08 |
| 2017/0287684 | A1 | * | 10/2017 | Gapinski | H01J 37/32944 |
| 2018/0108531 | A1 | * | 4/2018 | Thie | H01L 21/30655 |
| 2018/0350642 | A1 | * | 12/2018 | Mizuguchi | H01L 21/67288 |
| 2018/0350649 | A1 | * | 12/2018 | Gomm | H01J 37/32532 |

OTHER PUBLICATIONS

Sensitec, "The benefits of MagnetoResistive technology", 2018, p. 3, downloaded from the internet https://web.archive.org/web/20181005164624/https://www.sensitec.com/products-solutions/mr-sensor-technology/advantages (Year: 2018).*

The University of Utah, "High Voltage RF Generator Photo Gallery", p. 6, vailable online 2016, downloaded from https://chem.utah.edu/directory/anderson/research-group/rfgen/photos.php (Year: 2016).*

Huttinger, "Why is impedance matching important", p. 8, Aug. 2021, downloaded from http://www.if.ufrgs.br/~ckrug/pvd/rf-1.pdf (Year: 2021).*

Blattner et al, "High power RF and MF systems for sputter applications in flat panel display production.", pp. 10, 2009, downloaded from https://www.db-thueringen.de/receive/ (Year: 2009).*

Alam, "Etching Process Development of SiO2 Etching Using Inductively Coupled Plasma, thesis", 2015, p. 55, downloaded from https://core.ac.uk/download/pdf/32431486.pdf (Year: 2015).*

Lynn et al., "Real-time Virtual Metrology and Control for Plasma Etch" 2011, pp. 1-10 downloaded from https://www.sciencedirect.com/science/article/pii/S1474667016455540 (Year: 2011).*

* cited by examiner

ARCING PROTECTION METHOD AND PROCESSING TOOL

CROSS REFERENCE TO RELATED APPLICATIONS

This application claims the benefit of U.S. Provisional Application No. 62/583,062, filed on Nov. 8, 2017, the entirety of which is/are incorporated by reference herein.

BACKGROUND

Integrated circuits (ICs) have become increasingly important. Applications using ICs, such as cell phones, smartphones, tablets, laptops, notebook computers, PDAs, wireless email terminals, MP3 audio and video players, portable wireless web browsers and the like, are used by millions of people. Integrated circuits increasingly include powerful and efficient on-board data storage and logic circuitry for signal control and processing. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering the associated costs.

Various semiconductor processes have been used for manufacturing integrated circuits, and different intensities of the radio-frequency (RF) signals might be required for the semiconductor processes, especially the etching processes and the chemical vapor deposition (CVD) processes. Although existing etching and CVD systems and processes have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
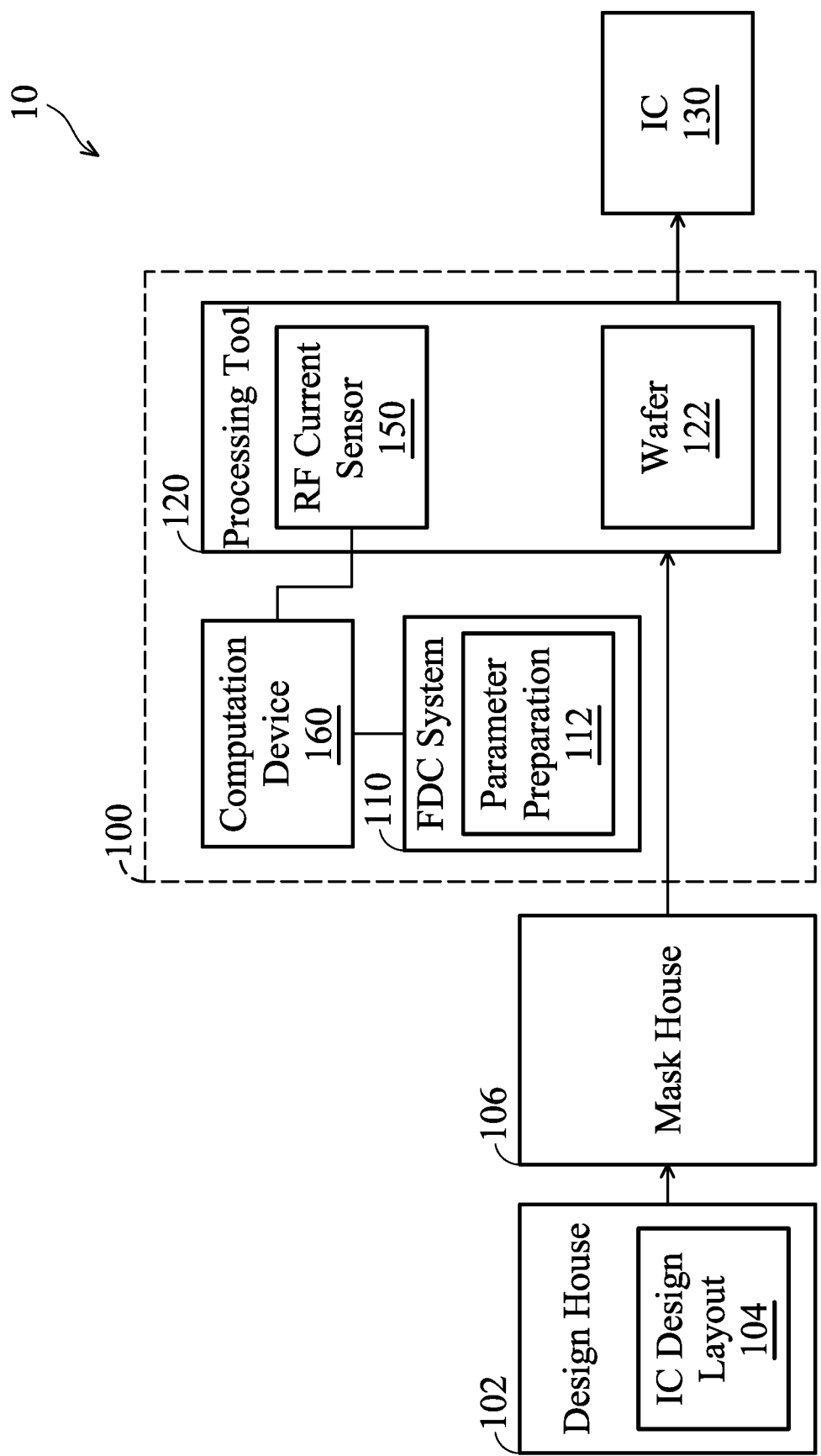
FIG. 1A is a schematic diagram of an integrated circuit (IC) manufacturing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1A is a simplified block diagram of an embodiment of an integrated circuit (IC) manufacturing system 10 and an associated IC manufacturing flow, which may benefit from various aspects of the present disclosure. The IC manufacturing system 10 includes a plurality of entities, such as a design house 102, a mask house 106 and a fabrication system 100, that interact with one another in the design, development, and manufacturing cycles and/or services related to manufacturing an integrated circuit (IC) device 130. The IC device 130 may include a plurality of semiconductor devices.

Furthermore, the fabrication system 100 includes a fault detection and classification (FDC) system 110, a processing tool 120 and a computation device 160. Instead, for simplicity and clarity, FIG. 1A shows only selected portions of the overall apparatus that facilitate an understanding of aspects of the present disclosure. Additional features can be added in the IC manufacturing system 10, and some of the features described below can be replaced or eliminated for other embodiments of the IC manufacturing system 10.

The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 102, mask house 106, FDC system 110, and processing tool 120 may be owned by a single larger company, and may even coexist in a common facility and use common resources.

The design house (or design team) 102 generates an IC design layout 104. In some embodiments, the IC design layout 104 includes processing data which are used in semiconductor processes for manufacturing the IC device 130. The processing data could include at least one design parameter and at least one etching parameter of an etching process of a thin film of a semiconductor device of the IC device 130. For example, the design parameter could be pattern-density (PD). In addition, the processing data could include at least one design parameter and at least one deposition parameter of a CVD process of a thin film of a semiconductor device of the IC device 130.

Design house 102 generates an IC design layout 104 (also referred to as an IC design pattern). IC design layout 104 includes various circuit patterns (represented by geometrical shapes) designed for an IC product based on specifications of an IC product to be manufactured. The circuit patterns correspond to geometrical patterns formed in various material layers (such as metal layers, dielectric layers, and/or semiconductor layers) that combine to form IC features (components) of the IC product, such as IC device 130. For example, a portion of IC design layout 104 includes various IC features to be formed in a substrate (for example, a silicon substrate) and/or in various material layers disposed on the substrate. The various IC features can include an active region, a gate feature (for example, a gate dielectric and/or a gate electrode), a source/drain feature, an interconnection feature, a bonding pad feature, other IC feature, or combinations thereof. In some implementations, assist features are inserted into IC design layout 104 to provide imaging effects, process enhancements, and/or identification information. A geometry proximity correction (GPC) process, similar to an optical proximity correction (OPC) process used for optimizing mask patterns (mask layouts), may generate the assist features based on environmental impacts associated with IC fabrication, including etching loading effects, patterning loading effects, and/or chemical mechanical polishing (CMP) process effects. Design house 102 implements a proper design procedure to form IC design layout 104. The design procedure may include logic design, physical design, place and route, or combinations thereof. IC design layout 104 is presented in one or more data files having information of the circuit patterns (geometrical patterns). For example, IC design layout 104 is expressed in a Graphic Database System file format (such as GDS or GDSII). In another example, IC design layout 104 is expressed in another suitable file format, such as Open Artwork System Interchange Standard file format (such as OASIS or OAS).

Mask house 106 uses IC design layout 104 to manufacture one or more masks, which are used for fabricating various layers of IC device 130 according to IC design layout 104. A mask (also referred to as a photomask or reticle) refers to a patterned substrate used in a lithography process to pattern a wafer, such as a semiconductor wafer. Mask house 106 performs mask data preparation, where IC design layout 104 is translated into a form that can be written by a mask writer to generate a mask. For example, IC design layout 104 is translated into machine readable instructions for a mask writer, such as an electron-beam (e-beam) writer. Mask data preparation generates a mask pattern (mask layout) that corresponds with a target pattern defined by the design layout 104. The mask pattern is generated by fracturing the target pattern of IC design layout 104 into a plurality of mask features (mask regions) suitable for a mask making lithography process, such as an e-beam lithography process. The fracturing process is implemented according to various factors, such as IC feature geometry, pattern density differences, and/or critical dimension (CD) differences, and the mask features are defined based on methods implemented by the mask writer for printing mask patterns. In some implementations, where an e-beam writer uses a variable-shaped beam (VSB) method for printing mask patterns, a mask pattern is generated by fracturing IC design layout 104 into polygons (such as rectangles or trapezoids), where a corresponding mask shot map includes exposure shot information for each polygon. For example, at least one corresponding exposure shot, including an exposure dose, an exposure time, and/or an exposure shape, is defined for each polygon. In some implementations, where an e-beam writer uses a character projection (CP) method for printing mask patterns, a mask pattern is generated by fracturing IC design layout 104 into characters (typically representing complex patterns) that correspond with a stencil used by the e-beam writer, where a corresponding mask shot map includes exposure shot information for each character. For example, at least one corresponding exposure shot, including an exposure dose, an exposure time, and/or an exposure shape, is defined for each character. In such implementations, any portions of fractured IC design layout 104 that do not match characters in the stencil can be printed using the VSB method.

Mask data preparation can include various processes for optimizing the mask pattern, such that a final pattern formed on a wafer (often referred to as a final wafer pattern) by a lithography process using a mask fabricated from the mask pattern exhibits enhanced resolution and precision. For example, mask data preparation includes an optical proximity correction (OPC), which uses lithography enhancement techniques to compensate for image distortions and errors, such as those that arise from diffraction, interference, and/or other process effects. OPC can add assist features, such as scattering bars, serifs, and/or hammerheads, to the mask pattern according to optical models or optical rules such that, after a lithography process, a final pattern on a wafer exhibits enhanced resolution and precision. In some implementations, the assist features can compensate for line width differences that arise from different densities of surrounding geometries. In some implementations, the assist features can prevent line end shortening and/or line end rounding. OPC can further correct for e-beam proximity effects and/or perform other optimization features. In some implementations, mask data preparation can implement a mask rule check (MRC) process that checks the mask pattern after undergoing an OPC process, where the MRC process uses a set of mask creation rules. The mask creation rules can define geometric restrictions and/or connectivity restrictions to compensate for variations in IC manufacturing processes. In some implementations, mask data preparation can include a lithography process check (LPC), which simulates wafer making processes that will be implemented by IC manufacturer to fabricate IC device 130. In some implementations, LPC simulates an image of a mask based on a generated mask pattern using various LPC models (or rules), which may be derived from actual processing parameters implemented by the fabrication system 100. The processing parameters can include parameters associated with various processes of the IC manufacturing cycle, parameters associated with tools used for manufacturing IC device 130, and/or other aspects of the manufacturing process. LPC takes into account various factors, such as image contrast, depth of focus ("DOF"), mask error sensitivity ("MEEF"), other suitable factors, or combinations thereof. After a simulated manufactured device has been created by LPC, if the simulated device is not close enough in shape to satisfy design rules, certain steps in mask data preparation, such as OPC and MRC, may be repeated to further refine the IC design layout. It should be understood that mask data preparation has been simplified for the purposes of clarity, and mask data preparation can include additional features, processes, and/or operations for modifying the IC design layout 104 to compensate for limitations in lithographic processes used by fabrication system 100.

Mask house 106 also performs mask fabrication, where a mask is fabricated according to the mask pattern generated by mask data preparation. In some implementations, the mask pattern is modified during mask fabrication to comply with a particular mask writer and/or mask manufacturer. During mask fabrication, a mask making process is implemented that fabricates a mask based on the mask pattern (mask layout). The mask includes a mask substrate and a patterned mask layer, where the patterned mask layer includes a final (real) mask pattern. The final mask pattern, such as a mask contour, corresponds with the mask pattern (which corresponds with the target pattern provided by IC design layout 104). In some implementations, the mask is a binary mask. In such implementations, according to one example, an opaque material layer (such as chromium) is formed over a transparent mask substrate (such as a fused quartz substrate or calcium fluoride ($CaF_2$)), and the opaque material layer is patterned based on the mask pattern to form a mask having opaque regions and transparent regions. In some implementations, the mask is a phase shift mask (PSM) that can enhance imaging resolution and quality, such as an attenuated PSM or alternating PSM. In such implementations, according to one example, a phase shifting material layer (such as molybdenum silicide (MoSi) or silicon oxide ($SiO_2$)) is formed over a transparent mask substrate (such as a fused quartz substrate or calcium fluoride ($CaF_2$)), and the phase shifting material layer is patterned to form a mask having partially transmitting, phase shifting regions and transmitting regions that form the mask pattern. In another example, the phase shifting material layer is a portion of the transparent mask substrate, such that the mask pattern is formed in the transparent mask substrate. In some implementations, the mask is an extreme ultraviolet (EUV) mask. In such implementations, according to one example, a reflective layer is formed over a substrate, an absorption layer is formed over the reflective layer, and the absorption layer (such as a tantalum boron nitride (TaBN)) is patterned to form a mask having reflective regions that form the mask pattern. The substrate includes a low thermal expansion material (LTEM), such as fused quartz, $TiO_2$ doped $SiO_2$, or other suitable low thermal expansion materials. The reflective layer can include multiple layers formed on the substrate, where the multiple layers include a plurality of film pairs, such as molybdenum-silicide (Mo/Si) film pairs, molybdenum-beryllium (Mo/Be) film pairs, or other suitable material film pairs configured for reflecting EUV radiation (light). The EUV mask may further include a capping layer (such as ruthenium (Ru)) disposed between the reflective layer and the absorption layer. Alternatively, another reflective layer is formed over the reflective layer and patterned to form an EUV phase shift mask.

Mask fabrication can implement various lithography processes for fabricating the mask. For example, the mask making process includes a lithography process, which involves forming a patterned energy-sensitive resist layer on a mask material layer and transferring a pattern defined in the patterned resist layer to the mask patterning layer. The mask material layer is an absorption layer, a phase shifting material layer, an opaque material layer, a portion of a mask substrate, and/or other suitable mask material layer. In some implementations, forming the patterned energy-sensitive resist layer includes forming an energy-sensitive resist layer on the mask material layer (for example, by a spin coating process), performing a charged particle beam exposure process, and performing a developing process. The charged particle beam exposure process directly "writes" a pattern into the energy-sensitive resist layer using a charged particle beam, such as an electron beam or an ion beam. Since the energy-sensitive resist layer is sensitive to charged particle beams, exposed portions of the energy-sensitive resist layer chemically change, and exposed (or non-exposed) portions of the energy-sensitive resist layer are dissolved during the developing process depending on characteristics of the energy-sensitive resist layer and characteristics of a developing solution used in the developing process. After development, the patterned resist layer includes a resist pattern that corresponds with the mask pattern. The resist pattern is then transferred to the mask material layer by any suitable process, such that a final mask pattern is formed in the mask material layer. For example, the mask making process can include performing an etching process that removes portions of the mask material layer, where the etching process uses the patterned energy-sensitive resist layer as an etch mask during the etching process. After the etching process, the lithography process can include removing the patterned energy-sensitive resist layer from the mask material layer, for example, by a resist stripping process.

The fabrication system 100, such as a semiconductor foundry, uses the mask (or masks) fabricated by the mask house 106 to fabricate the IC device 130. For example, a wafer making process is implemented that uses a mask to fabricate a portion of IC device 130 on a wafer. In some implementations, the fabrication system 100 performs wafer making process numerous times using various masks to complete fabrication of IC device 130. Depending on the IC fabrication stage, the wafer can include various material layers and/or IC features (for example, doped features, gate features, source/drain features, and/or interconnect features) when undergoing the wafer making process. The wafer making process includes a lithography process, which involves forming a patterned resist layer on a wafer material layer using a mask, such as the mask fabricated by mask house 106, and transferring a pattern defined in the patterned resist layer to the wafer material layer. The wafer material layer is a dielectric layer, a semiconductor layer, a conductive layer, a portion of a substrate, and/or other suitable wafer material layer.

Forming the patterned resist layer can include forming a resist layer on the wafer material layer (for example, by spin coating), performing a pre-exposure baking process, performing an exposure process using the mask (including mask alignment), performing a post-exposure baking process, and performing a developing process. During the exposure process, the resist layer is exposed to radiation energy (such as ultraviolet (UV) light, deep UV (DUV) light, or extreme UV (EUV) light) using an illumination source, where the mask blocks, transmits, and/or reflects radiation to the resist layer depending on a final mask pattern of the mask and/or mask type (for example, binary mask, phase shift mask, or EUV mask), such that an image is projected onto the resist layer that corresponds with the final mask pattern. This image is referred to herein as a projected wafer image. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the final mask pattern. An after development inspection (ADI) can be performed to capture information associated with the resist pattern, such as critical dimension uniformity (CDU) information, overlay information, and/or defect information.

Transferring the resist pattern defined in the patterned resist layer to the wafer material layer is accomplished in numerous ways, such that a final wafer pattern is formed in the wafer material layer. For example, the wafer making process can include performing an implantation process to form various doped regions/features in the wafer material layer, where the patterned resist layer is used as an implantation mask during the implantation process. In another example, the wafer making process can include performing an etching process that removes portions of the wafer material layer, where the etching process uses the patterned resist layer as an etch mask during the etching process. After the implantation process or the etching process, the lithography process includes removing the patterned resist layer from the wafer, for example, by a resist stripping process. In yet another example, the wafer making process can include performing a deposition process that fills openings in the patterned resist layer (formed by the removed portions of the resist layer) with a dielectric material, a semiconductor material, or a conductive material. In such implementations, removing the patterned resist layer leaves a wafer material layer that is patterned with a negative image of the patterned resist layer. An after etch inspection (AEI) is performed to capture information, such as critical dimension uniformity (CDU), associated with the final wafer pattern formed in the wafer material layer.

In some embodiments, the IC design layout 104 may further include various geometrical patterns designed for the IC device 130. The geometrical patterns correspond to patterns of metal, oxide, or semiconductor layers that make up the various components of the IC device 130 to be fabricated. The various layers combine to form various IC features. For example, a portion of the IC design layout 104 includes various IC features, such as active regions, gate electrodes, sources and drains, metal lines or vias of an interlayer interconnection, and openings for bonding pads, to be formed in a semiconductor substrate (such as a silicon wafer) and various material layers disposed on the semiconductor substrate. The design house 102 implements a proper design procedure to form the IC design layout 104. The design procedure may include logic design, physical design, and/or place and route.

The FDC system 110 includes a parameter preparation 112, and the parameter preparation 112 receives the IC design layout 104 from the design house 102 to generate processing parameters for manufacturing the semiconductor devices on the wafer 122. Specifically, the processing parameters may include an etching parameter, a pattern density (PD) and/or an end point (EP) time. The EP time is a period for etching the thin film of the semiconductor device. In one embodiment, the etching parameter includes flow rate of $O_2$, flow rate of $CHF_3$, flow rate of $Cl_2$, and/or temperature for etching the thin film.

The FDC system 110 is utilized to determine processing parameters including an etching parameter or a CVD parameter. The determined processing parameters are transmitted to the processing tool 120. Therefore, the etching process or the CVD process is performed on the wafer 122 in the processing tool 120 according to the processing parameters which were determined by the FDC system 110.

The processing tool 120 in a semiconductor foundry uses the processing parameters generated by the FDC system 110 to fabricate the IC device 130. The IC manufacturer of the processing tool 120 is an IC fabrication business that can include a myriad of manufacturing facilities for the fabrication of a variety of different IC products. For example, there may be a first manufacturing facility for the front end fabrication of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In the present embodiment, a wafer 122 is fabricated using a mask to form the IC device 130. The semiconductor wafer includes a silicon substrate or another proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer 122 may further include various doped regions, dielectric features, and multilevel interconnects (formed in subsequent manufacturing steps).

The RF sensor 150 is utilized to monitor the intensity of RF signals for executing semiconductor processes on the wafer 122. In some embodiments, the processing tool 120 can be any processing tool which uses RF signals for executing semiconductor process, such as etching process or CVD process, on the wafer 122. In some embodiments, the RF sensor 150 is utilized to monitor the intensity of RF signals for executing the etching process or the CVD process on the wafer 122 in the processing tool 120. In some embodiments, the RF sensor 150 includes a coaxial connector and a metal coil, and the coaxial connector is surrounded by the metal coil. Specifically, the processing tool 120 receives an RF signal from a RF signal generator 180 (shown in FIG. 2), and the RF sensor 150 is configured to detect the intensity of the RF signal by electronic-magnetic induction between the RF signal and the metal coil of the RF sensor 150.

The computation device 160 is coupled between the RF sensor 150 and the FDC system 110 in order to extract statistical characteristics based on the detection of the intensity of the RF signal by the RF sensor 150. The extracted statistical characteristics include the maximum intensity of the RF signal, the range of the intensity of the RF signal, and the standard deviation of the intensity of the RF signal. Afterwards, the FDC system 110 is utilized to determine whether or not the intensity of the RF signal meets a threshold value or threshold range according to the extracted statistical characteristics. When the intensity of the RF signal does not meet the threshold value or the threshold range, the RF signal will be adjusted by the RF signal generator 180 or stop tool to check parts damage or not to meet the threshold value or the threshold range.

Figure 1B:
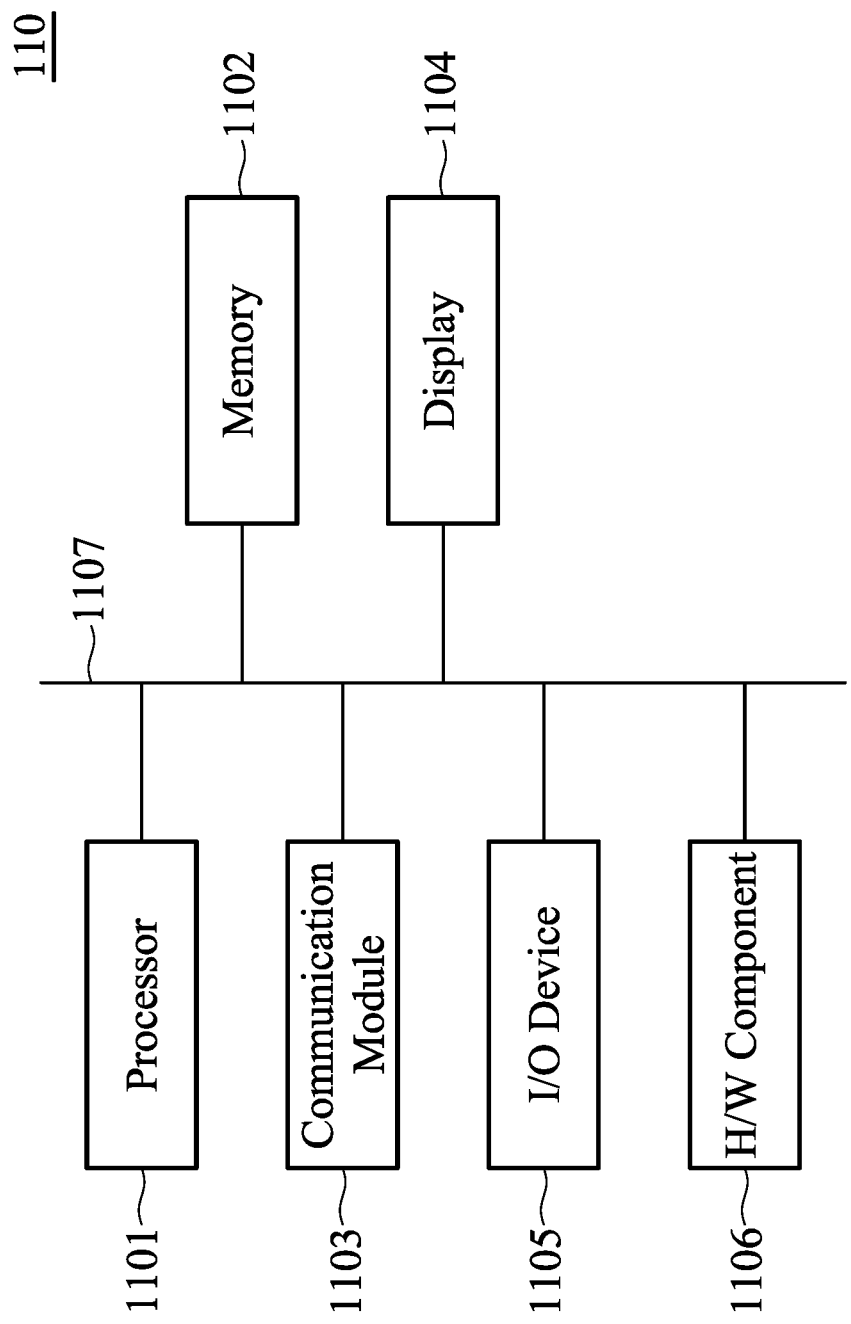
FIG. 1B is a schematic diagram of a fault detection and classification (FDC) system of the integrated circuit manufacturing system in accordance with some embodiments.
Figure 5:
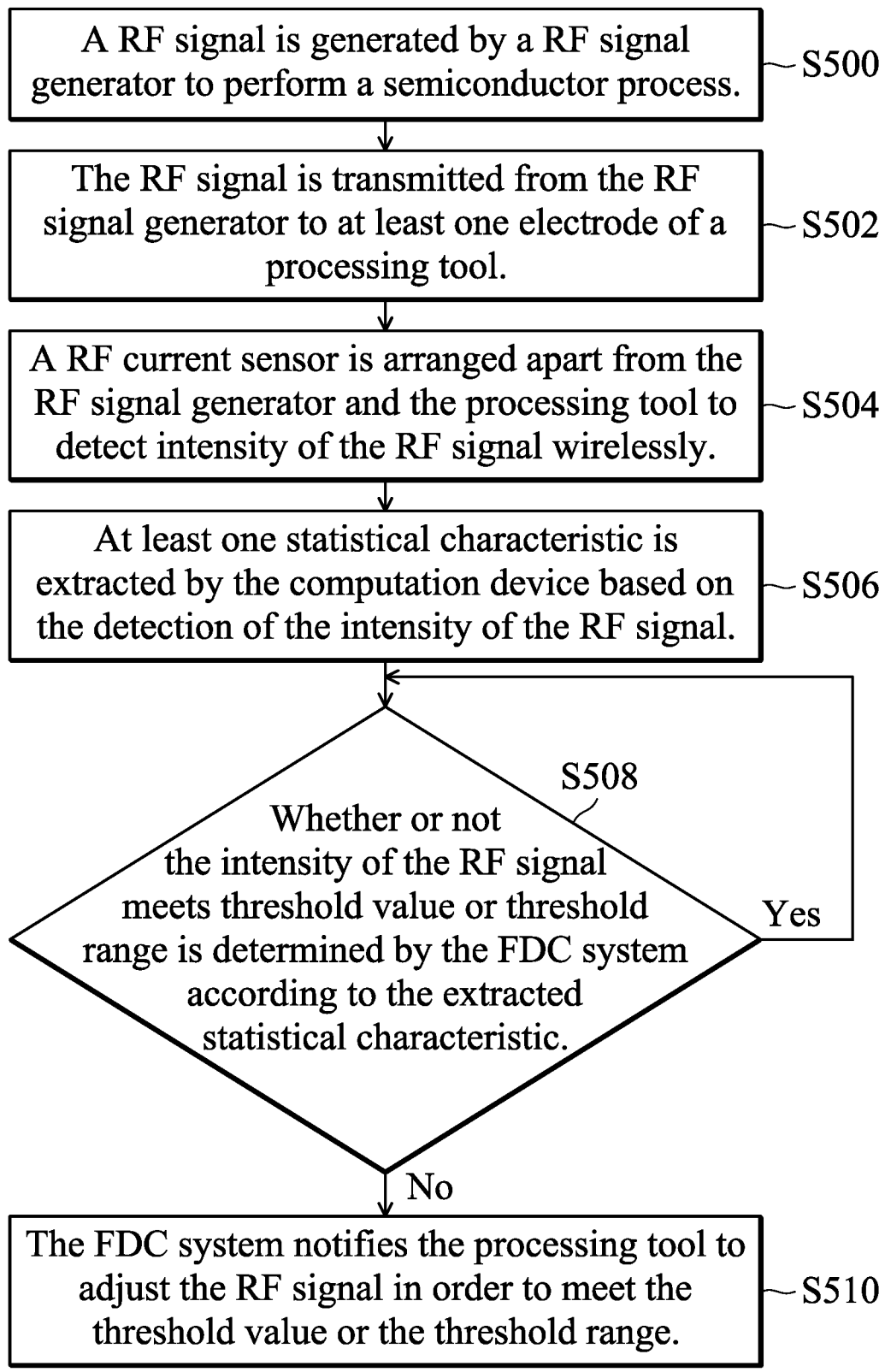
FIG. 5 is a flow chart of a method illustrating the arcing protection for the IC in association with the arcing protection apparatus, in accordance with some embodiments.

FIG. 1B is a more detailed block diagram of the FDC system 110 shown in FIG. 1A according to various aspects of the present disclosure. Operations described with respect to FIG. 5 is realized in some embodiments by the FDC system 110 of FIG. 1B. The FDC system 110 includes a processor 1101, a memory 1102, a communication module 1103, a display 1104, an input/output (I/O) device 1105, and one or more hardware components 1106 communicatively coupled via a bus 1107 or another interconnection communication mechanism.

The processor 1101 could include a digital signal processor (DSP), a microcontroller (MCU), a central-processing unit (CPU) or a plurality of parallel processors relating the parallel processing environment to implement the operating system (OS), firmware, driver and/or other applications of the FDC system 110.

The memory 1102 comprises, in some embodiments, a random access memory (RAM) or another dynamic storage device or read only memory (ROM) or other static storage devices, coupled to the bus 1107 for storing data and/or instructions to be executed by the processor 1101. The memory 1102 is also used, in some embodiments, for storing temporary variables or other intermediate information during the execution of instructions to be executed by the processor 1101.

The communication module 1103 is operable to communicate information with the other components in the IC manufacturing system 10, such as the mask house 106, computation device 160 and the processing tool 120. Examples of communication modules may include Ethernet cards, 802.11 WiFi devices, cellular data radios, and/or other suitable devices known in the art.

The display 1104 is utilized to display the processing data and processing parameters of the IC device 130. The display 1104 can be a liquid-crystal panel or a touch display panel. The I/O device 1105 includes an input device, an output device and/or a combined input/output device for enabling user interaction with the FDC system 110. An input device comprises, for example, a keyboard, keypad, mouse, trackball, trackpad, and/or cursor direction keys for communicating information and commands to the processor 1101. An output device comprises, for example, a display, a printer, a voice synthesizer, etc. for communicating information to the user.

Figure 2:
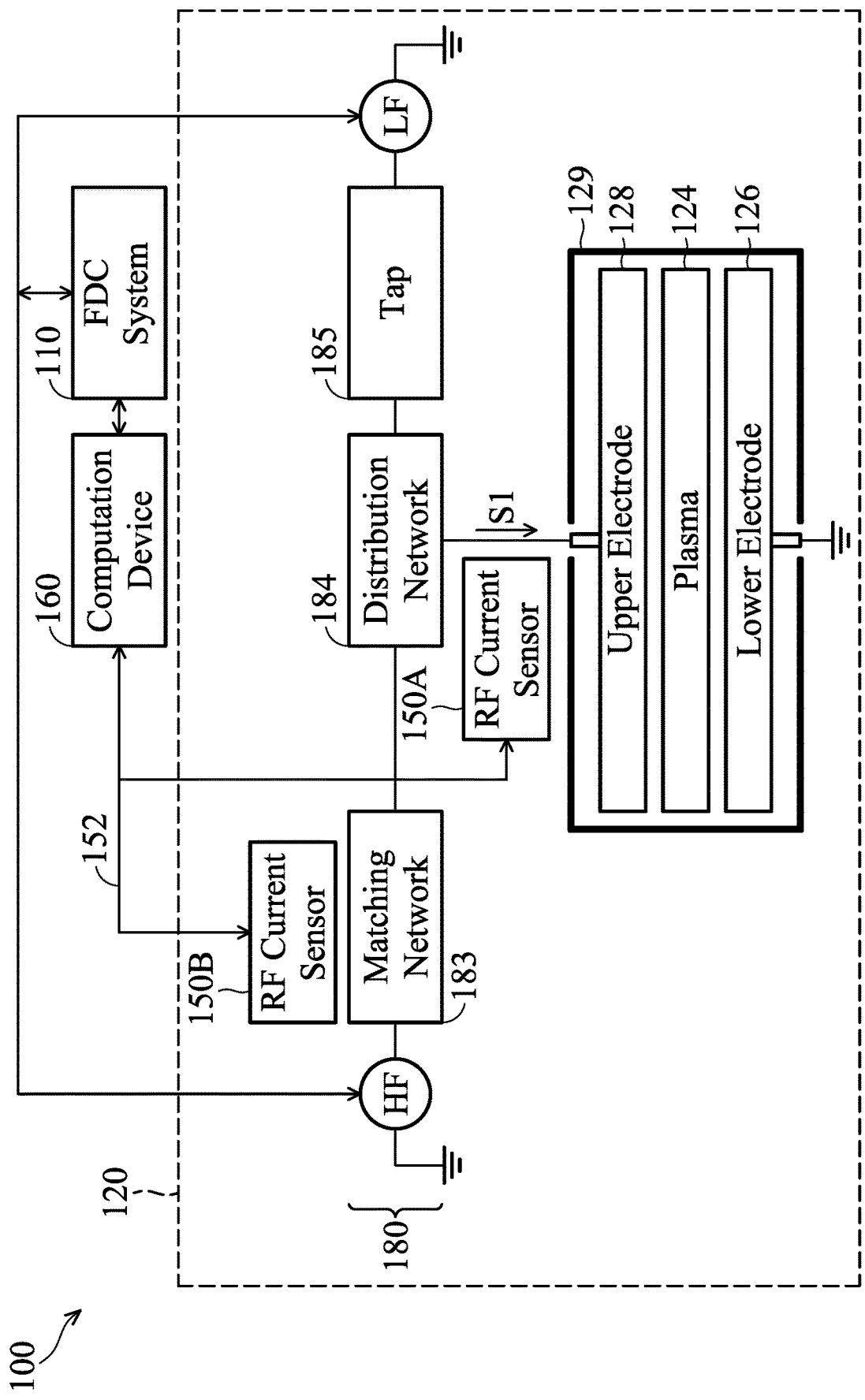
FIG. 2 is a schematic diagram of an arcing protection apparatus of the IC manufacturing system, in accordance with some embodiments.

FIG. 2 is a schematic diagram of a fabrication system 100 of the IC manufacturing system 10, in accordance with some embodiments. The fabrication system 100 includes a processing tool 120, a FDC system 110 and a computation device 160. The processing tool 120 includes an RF signal generator 180, at least one RF sensor (for example, two RF sensors 150A and 150B), at least one electrode (for example, the upper electrode 128 and the lower electrode 126). As shown in FIG. 2, the RF signal generator 180 includes a high-frequency signal source HF, a low-frequency signal source LF, a matching network 183, a distribution network 184 and a tap 185.

Instead, for simplicity and clarity, FIG. 2 shows only selected portions of the overall apparatus that facilitate an understanding of aspects of the present disclosure. Additional features can be added in the fabrication system 100, and some of the features described below can be replaced or eliminated for other embodiments of the fabrication system 100.

More specifically, the high-frequency signal source HF generates high-frequency signals. In some embodiments, the frequency of the high-frequency signals generated by the high-frequency signal source HF can be on the range of 1 MHz to 100 MHz, such as 13.56 MHz. The matching network 183 is coupled to the high-frequency signal source HF to decrease reflectiveness of the high-frequency signal for generating the RF signal. In addition, the low-frequency signal source LF generates low-frequency signals. In some embodiments, the frequency of the low-frequency signals generated by the low-frequency signal source LF can be on the range of 10 KHz to 1 MHz, such as 400 KHz. The tap 185 is coupled to the low-frequency signal source LF in order to stabilize the frequency of the low-frequency signal.

Furthermore, the distribution network 184 is coupled between the matching network 183 and the tap 185 to combine and distribute the LF signal and the HF signal in order to generate the RF signal. Afterwards, the RF signal S1 is transmitted from the distribution network 184 into the processor chamber of the processing tool 120 to perform the etching process or the CVD process. In some embodiments, the RF signal is transmitted to the electrode 128 in the processing chamber 129 of the processing tool 120, but it is not limited thereto.

It should be noted that the generating of the RF signal might differ from various kinds of manufacturing processes in the processing tool 120. In some embodiments, when the CVD process is performed in the processing tool 120, the RF signal is obtained by combining and distributing the high-frequency signals from the high-frequency signal source HF and the low-frequency signals from the low-frequency signal source LF. In other embodiments, when the etching process is performed in the processing tool 120, the RF signal is obtained by the high-frequency signal from the high-frequency signal source HF without combining and distributing the low-frequency signal from the low-frequency signal source LF.

In addition, as shown in FIG. 2, the processing tool 120 also includes a process chamber 129, an upper electrode 128, a plasma region 124 and a lower electrode 126. The upper electrode 128, the plasma region 124 and the lower electrode 126 are arranged within the process chamber 129. The upper electrode 128 is positioned over the lower electrode 126. In some embodiments, the lower electrode 126 is above the upper electrode 128 and parallel with the upper electrode 128, and the plasma region is arranged between the upper electrode 128 and the lower electrode 126. The RF signal is transmitted from the RF signal generator 180 to the upper electrode 128. The processing tool 120 has an oxygen-free atmosphere to ensure that RF signal generated by the RF signal generator 180, is not absorbed by the chamber environment. The processing chamber 129 may be a vacuum chamber. A suitable temperature is maintained within the processing chamber 129. In some embodiments, the upper electrode 128 is configured to receive the RF signal S1, and the lower electrode 126 is configured to connect to ground. In some embodiments, the upper electrode 128 is configured to receive the RF signal S1, and the lower electrode 126 is configured to connect to ground and another RF signal.

In some embodiments, the lower electrode 126 is arranged with a pedestal for supporting the wafer 122. In other embodiments, the lower electrode 126 may include a heating mechanism for heating the wafer 122. In an example, a position of the wafer 122 inside the process chamber 129 is adjusted by a mechanism of the wafer holder or wafer stage (not shown) that allows the wafer holder to move within the process chamber 129. For example, the wafer holder may move vertically, horizontally, or both to position the wafer 122 a particular distance from the upper electrode 128 or the lower electrode 126.

It should be noted that RF energy created by the RF signal is conditioned by the matching network 183, the distribution network 184 and the tap 185. The RF energy is capacitively coupled to the upper electrode 128 by means of variable capacitors. The matching network 183 functions to minimize the reflection of RF power back from the processing tool 120 which would otherwise reduce the efficiency of the generated plasma. Such power reflection is generally caused by a mismatch in the impedance of the RF signal generator 180 and a load which is formed by the combination of the electrostatic chuck (ESC) and the plasma generated within the process chamber 129.

In some embodiments, the RF sensors 150A and 150B are utilized to monitor and detect the intensity of RF signals wirelessly for executing the etching process or the CVD process on the wafer 122 by the processing tool 120. Specifically, the RF signal is transmitted to the processing tool 120 inside the process chamber 129, and the RF sensors 150A and 150B are configured to detect the intensity of the RF signal by electronic-magnetic induction between the RF signal and the metal coils of the RF sensors 150A and 150B.

In some embodiments, the RF sensor 150A is arranged between the distribution network 184 and the processing chamber 129 to detect the RF signal S1 transmitted from the distribution network 184 to the upper electrode 128 of the processing tool 120. More specifically, the RF sensor 150A is arranged adjacent to the wiring between the distribution network 184 and the processing chamber 129. In other embodiments, the RF sensor 150B is arranged adjacent to the matching network 183 to detect the RF signal transmitted form the high-frequency signal source HF to the distribution network 184.

It should be noted that since the intensity of the RF signal is detected wirelessly by the RF sensors 150A and 150B, the RF sensors 150A and 150B are apart from the processing tool 120 and each component of the RF signal generator 180. In other words, the RF sensors 150A and 150B do not attach to the wiring and components of the processing tool 120 and each component of the RF signal generator 180. Because the RF signal is not coupled or connected to the RF sensors 150A and 150B (i.e., the RF sensors 150A and 150B do not interfere the RF signal), the intensity of the RF signal will not deteriorate due to the real-time detection of the RF sensors 150A and 150B. Therefore, the process in association with the RF signal will not be affected during the detection of the RF sensors 150A and 150B.

As shown in FIG. 2, the coaxial connector 152 is arranged to connect the computation device 160 and the RF sensor 150A/150B. After the intensity is measured by the RF sensors 150A and 150B, the computation device 160 converts the measured intensity of the RF signal S1 into statistical characteristics of electronic signals. For example, the computation device 160 can be implemented by the Field Programmable Gate Array (FPGA) in association with analog-digital converter and network.

In some embodiments, the computation device 160 samples and extracts the measured intensity (such as current, voltage or power) of the RF signal S1 and translates the measured intensity into a form readable by an instrument, such as the FDC system 110. For example, the sampling rate of the computation device 160 is 150 MHz/sec, which can be adjusted by the FPGA. Therefore, the RF sensors 150A and 150B associated with the computation device 160 and the FDC system 110 can thus measure changes, such as intensity variations, in electro-magnetic conduction caused by the RF signal S1.

In some embodiments, the FDC system 110 establishes a baseline of tool operation, such as a baseline of operation for the fabrication system 100, and compares current operation of the fabrication system 100 with the baseline operation to detect faults as well as classify or determine a root cause of any variances between the baseline and current operation. The techniques used for FDC include statistical process control (SPC), principle component analysis (PCA), partial least squares (PLS), other suitable techniques, and combinations thereof.

In an example, the FDC system 110 monitors whether the intensity of the RF signal S1 is within a threshold range of intensities. In another example, the FDC system 110 monitors whether the measured intensity has risen above a threshold value, or fallen below a threshold value. When the FDC system 110 determines that the measured intensity is not at a suitable level, the FDC system 110 communicates with the RF signal generator 180 to adjust processing conditions. In some embodiments, the FDC system 110 may communicate with the high-frequency signal source HF and/or the low-frequency signal source LF of the fabrication system 100 so that the high-frequency signal source HF and/or the low-frequency signal source LF adjusts its signal output, thereby adjusting the intensity of the RF signal S1 received by the processing tool 120 to perform the semiconductor manufacturing process. Accordingly, accurate real-time monitoring of a process that uses the RF signal S1, such as an etching process or a CVD process, is achieved.

In some embodiments, the FDC system 110 determines whether or not the measured intensity of the RF signal S1 meets the threshold value or the threshold range, which includes determining whether the maximum intensity of the RF signal S1 is greater than the threshold value, determining whether the range of the intensity of the RF signal S1 falls outside the threshold range. For example, when an etching process is performed in the processing tool 120, the FDC system 110 determines whether or not the intensity of the RF signal S1 is greater than the threshold value. When a CVD process is performed in the processing tool 120, the FDC system 110 determines whether or not the intensity of the RF signal S1 falls outside the threshold range.

Figure 3:
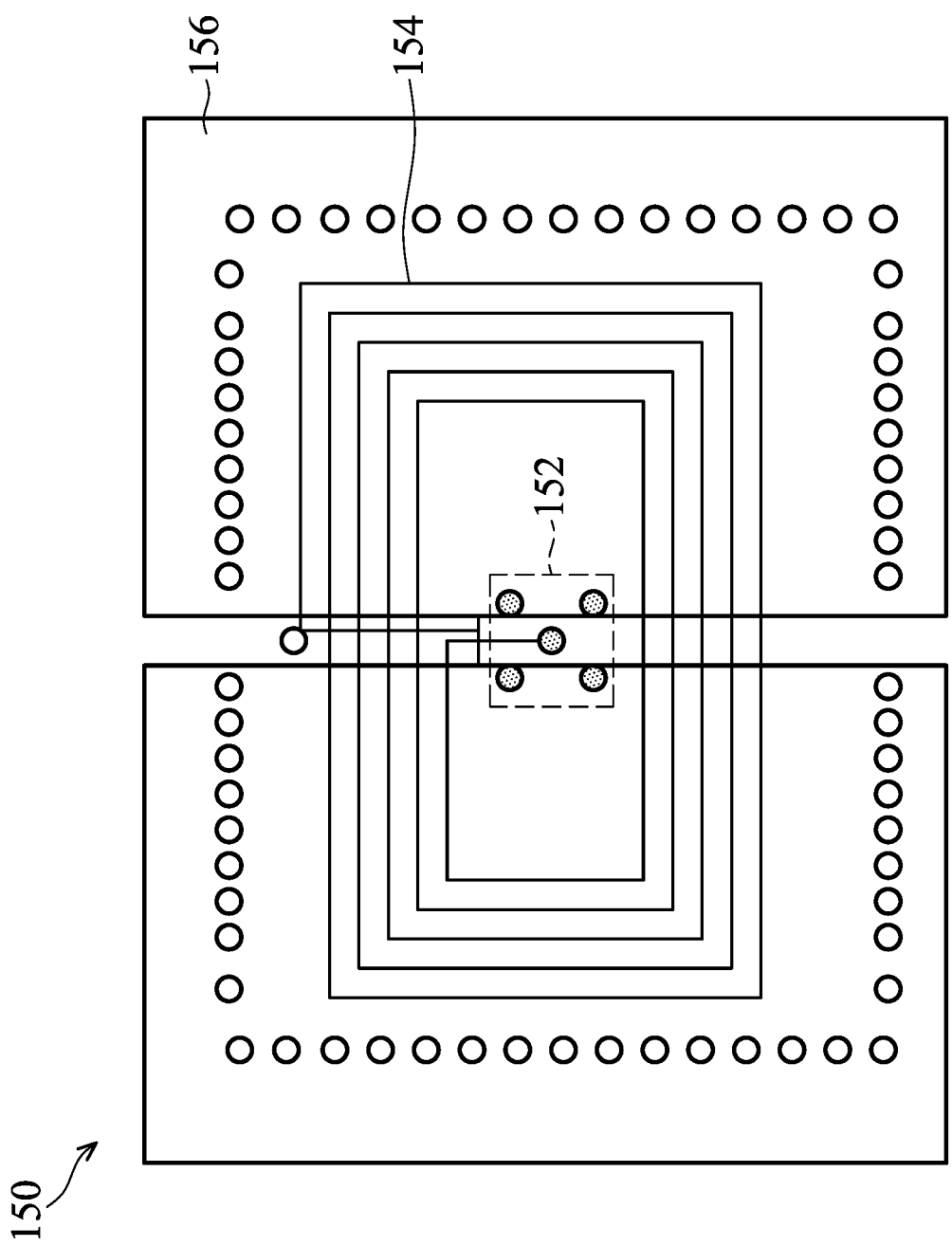
FIG. 3 is a schematic diagram of an RF sensor of the arcing protection apparatus for detecting the intensity of the RF signals, in accordance with some embodiments.

FIG. 3 is a schematic diagram of an RF sensor 150 of the fabrication system 100 for detecting the intensity of the RF signal S1s, in accordance with some embodiments. As shown in FIG. 3, the RF sensor 150 includes a coaxial connector 152, a metal coil 154 and a circuit board 156. The coaxial connector 152 is arranged at the central portion of the circuit board 156. The coaxial connector 152 is surrounded by the metal coil 154 which is arranged on the circuit board 156. In addition, the coaxial connector 152 passes through a coaxial cable to connect the computation device 160.

In some embodiments, the RF sensor 150 is arranged near the RF signal S1 without directly contacting (or physically contacting) the wiring or component of the RF signal generator. In some embodiment, the RF sensor 150 is an RF current sensor. Accordingly, the magnetic field caused by the RF signal S1 passes through the metal coil 154, and an inducting current is generated correspondingly by the metal coil 154 because of the electro-magnetic induction. When the intensity of the RF signal S1 increases, the electro-magnetic induction becomes more obvious, and the inducting current increases correspondingly. In other words, the inducting current of the RF sensor 150 is proportional to the intensity of the RF signal S1. Therefore, the RF sensor 150 can be utilized to measure and detect the intensity of the RF signal S1.

Figure 4:
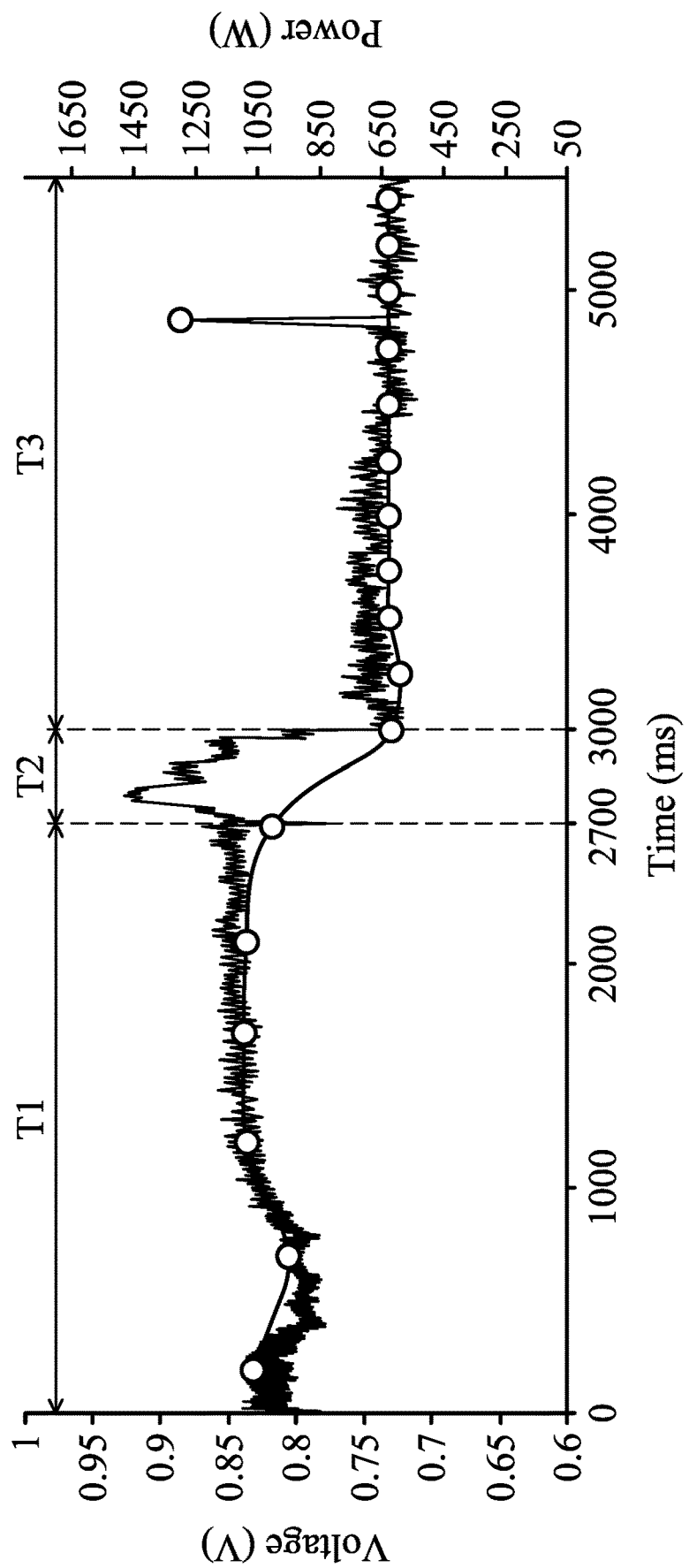
FIG. 4 is a schematic illustrating the detection of the intensity of RF signal by an RF sensor of the arcing protection apparatus, in accordance with some embodiments.

FIG. 4 is a schematic illustrating the detection of the intensity of RF signal S1 by an RF sensor 150 of the processing tool 120, in accordance with some embodiments. The detection of the intensity of the RF signal S1 is measured as voltage or power based on the induction current generated by the RF sensor. As shown in FIG. 4, the detecting duration is divided into three periods T1, T2 and T3. The period T1 starts from 0 ms to 2700 ms, the period T2 starts from 2700 ms to 3000 ms, and the period T3 starts from 3000 ms to 5500 ms.

In some embodiments, a first semiconductor process is executed during the period T1, and a second semiconductor process is executed during the period T3. During the period T2, the semiconductor process is switched from the first semiconductor process to the second semiconductor process. In other words, no semiconductor process is executed during the period T2. In some embodiments, the first semiconductor process can be the etching process or the CVD process, and the second semiconductor process can be the etching process or the CVD process.

In some embodiments, the first semiconductor process and the second semiconductor process are both etching process. The computation device 160 extracts maximum intensity of the measured RF signal S1 to be the statistical characteristics, and the FDC system 110 determines whether or not the measured intensity of the RF signal S1 is greater than the threshold value. Furthermore, the threshold value is derived from the IC design layout 104 or the parameter preparation 112 as shown in FIG. 1A.

In some embodiments, the threshold value is 0.9V (also shown as 1350W) for the etching process during the period T1. As shown in FIG. 4, six values are extracted by the computation device 160 during the period T1, and the maximum among the six values does not exceed the threshold value, such as 0.9V and 1350W. Therefore, the FDC system 110 determines that the measured intensity of the RF signal S1 is normal and proper for the first semiconductor process.

In addition, during the period T3, the threshold value is 0.8V (also shown as 900W) as shown in FIG. 4. In some embodiments, the sampling rate of the second semiconductor process is increased to be twice the sampling rate of the first semiconductor process to improve the detecting accuracy. 12 values are extracted by the computation device 160 during the period T3. The maximum 12 values is 0.88V and 1300W, which exceeds the threshold value (i.e., 0.8V and 900W). Therefore, the FDC system 110 determines that the intensity of the RF signal S1 is abnormal for the second semiconductor process.

The FDC system 110 notifies the processing tool 120 to adjust the intensity of the RF signal S1 or stop tool to check parts damage or not in order to meet the threshold value. In some embodiments, the adjusted RF signal is configured to perform the semiconductor manufacturing process on next IC device, and/or on another IC device of next wafer. In some embodiments, an alert or a flash light can be utilized by the FDC system 110 for the notification.

FIG. 5 is a flow chart of a method illustrating the arcing protection for the IC in association with the processing tool 120 and the fabrication system 100, in accordance with some embodiments. In operation S500, an RF signal S1 is generated by an RF signal generator 180 to perform a semiconductor process. In operation S502, the RF signal S1 is transmitted from the RF signal generator 180 to at least one electrode 126 or 128 of the processing tool 120. In operation S504, an RF sensor 150 is arranged apart from the RF signal generator 180 and the processing tool 120 to wirelessly detect the intensity of the RF signal S1. Detailed structure and composition of the RF sensor 150 are illustrated in FIG. 3, and they would not be repeated in the flow chart.

Afterwards, in operation S506, at least one of the statistical characteristics are extracted by the computation device 160 based on the detection of the intensity of the RF signal S1 (i.e., the detected/measured intensity). In operation S508, whether or not the intensity of the RF signal S1 meets a threshold value or threshold range is determined by the FDC system 110 according to the extracted statistical characteristics. In some embodiments, when a CVD process is performed by the processing tool 120, the FDC system 110 determines whether or not the detected intensity of the RF signal S1 falls outside the threshold range (i.e., higher than the upper threshold value or lower than the lower threshold value). When an etching process is performed by the processing tool 120, the FDC system 110 determines whether the maximum intensity of the RF signal S1 is greater than the threshold value.

Furthermore, when the FDC system 110 determines that the detected intensity of the RF signal S1 meets a threshold value or threshold range, operation S510 will be not executed. When the FDC system 110 determines that the detected intensity of the RF signal S1 does not meet threshold value or threshold range, operation S510 will be executed. In operation S510, The FDC system 110 notifies the processing tool 120 to adjust the RF signal S1 or stop tool to check parts damage or not in order to meet the threshold value or the threshold range. For example, the intensity of the RF signal S1 can be increased or decreased by the RF signal generator 180 of the processing tool 120 to perform the semiconductor manufacturing process on next IC device, and/or on another IC device of next wafer.

In some embodiments, one or more of the operations and/or functions of the tools and/or systems described with respect to FIGS. 1-5 is/are implemented by specially configured hardware (e.g., by one or more application-specific integrated circuits or ASIC(s)) which is/are included) separate from or in lieu of the processor 610. Some embodiments incorporate more than one of the described operations and/or functions in a single ASIC.

In some embodiments, the operations and/or functions are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By utilizing the proposed processing tool and the proposed fabrication facility associated with the proposed arcing protection method, the RF signal S1 is not coupled or connected to the RF sensor 150 (i.e., the RF sensor 150 does not interferes the RF signal S1 generated by 180), the intensity of the RF signal S1 will not deteriorate due to the real-time detection of the RF sensor 150. Therefore, the process in association with the RF signal S1 will not be affected during the detection of the RF sensor 150. Furthermore, according to the detected intensity by the RF sensor 150, the FDC system 110 may communicate with the RF signal generator 180 of the fabrication system 100 so that the high-frequency signal source HF and/or the low-frequency signal source LF adjusts its signal output, thereby adjusting the intensity of the RF signal S1 received by the processing tool 120 to perform the semiconductor manufacturing process. Accordingly, accurate real-time monitoring of a process that uses the RF signal S1, such as an etching process or a CVD process, is achieved.

More specifically, when the RF-related semiconductor manufacturing process is executed in the process chamber 129, the plasma will be required for the RF-related semiconductor manufacturing process. However, the plasma or the RF signal S1 in the process chamber 129 may be unstable which results in the electrically charged thin insulation film. Furthermore, the electrically charged insulation thin film will be on the verge of electric breakdown to physiochemical damage which is known as arcing damage. Therefore, the arcing damage may occur in the process chamber 129 when the RF signal S1 is not stable or does not meets the threshold value.

In some embodiment, the arcing protection method is provided to real-time detect the arcing by utilizing the high speed sampling rate computation device 160 and the RF sensor 150. More specifically, the computation device 160 can be implemented by Field Programmable Gate Array (FPGA). The FPGA could be used for a wide variety of applications. By utilizing the FPGA as the computation device 160 in association with the RF sensor 150, the processing tool 120 can accelerate high-performance signal sampling rate and achieve computationally intensive system in order to prevent the arcing damage.

In accordance with some embodiments, a fabrication system for fabricating an integrated circuit (IC) is provided. The fabrication facility includes a processing tool, a computation device and a fault detection and classification (FDC) system. The processing tool includes at least one electrode and an RF sensor. The electrode is utilized to receive an RF signal from an RF signal generator during a semiconductor manufacturing process to fabricate the IC. The RF sensor wirelessly detects the intensity of the RF signal. The computation device is coupled to the RF sensor, and it extracts statistical characteristics based on the detection of the intensity of the RF signal. The FDC system is coupled to the computation device, and it is utilized to determine whether or not the intensity of the RF signal meets a threshold value or a threshold range according to the extracted statistical characteristics. When the detected intensity of the RF signal exceeds the threshold value or the threshold range, the FDC system notifies the processing tool to adjust the RF signal or stop tool to check parts damage.

In accordance with some embodiments, a processing tool for fabricating an IC is provided. The processing tool includes an RF signal generator, at least one electrode and at least one RF sensor. The RF signal generator is utilized to generate an RF signal. The electrode is utilized to execute a semiconductor manufacturing process by utilizing the RF signal to fabricate the IC. The RF sensor is arranged separately from the electrode and the RF signal generator to wirelessly detect the intensity of the RF signal. The detection of the intensity of the RF signal is utilized for extracting statistical characteristics using a computation device, and the statistical characteristics are transmitted to an FDC system. The RF sensor includes a metal coil and a coaxial connector which is surrounded by the metal coil, the coaxial connector is utilized to connect a coaxial cable, and the coaxial cable is utilized to connect the RF sensor and the computation device.

In accordance with some embodiments, an arcing protection method is provided. The arcing protection method includes: transmitting an RF signal from an RF signal generator to at least one electrode of a processing tool; arranging an RF sensor to wirelessly detect the intensity of the RF signal; extracting statistical characteristics based on the detection of the intensity of the RF signal; determining whether or not the detected intensity of the RF signal exceeds a threshold value or threshold range according to the extracted statistical characteristics; and adjusting the RF signal when the intensity of the RF signal exceeds the threshold value or the threshold range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fabrication system, comprising:
a processing tool, comprising:
at least one electrode, configured to receive a radio frequency (RF) signal from an RF signal generator during a first semiconductor manufacturing process and a second semiconductor manufacturing process; and
a RF sensor, configured to wirelessly detect intensity of the RF signal and comprising a circuit board, a coaxial connector arranged at a central portion of the circuit board and a metal coil arranged on the circuit board, wherein the coaxial connector is surrounded by the metal coil on the circuit board, and the metal coil is connected to the coaxial connector;
a computation device, connected to the RF sensor through the coaxial connector and a coaxial cable, and configured to extract statistical characteristics with a sampling rate based on the detected intensity of the RF signal; and
a fault detection and classification (FDC) system, communicatively connected to the processing tool and the computation device, wherein the FDC system comprises a processor, the processor is configured to determine whether or not the detected intensity of the RF signal exceeds a threshold value or a threshold range according to the extracted statistical characteristics, wherein when the detected intensity of the RF signal exceeds the threshold value or the threshold range, the processor notifies the processing tool to adjust the RF signal or stop tool to check parts damage,
wherein when the sampling rate is increased, the threshold value is decreased,
wherein the processing tool is configured to switch from the first semiconductor manufacturing process to the second semiconductor manufacturing process during a transition period, and the detected intensity of the RF signal in the transition period is greater than the detected intensity of the RF signal in the first and second semiconductor manufacturing processes,
wherein the first semiconductor process and the second semiconductor process are etching processes,
wherein when the detected intensity of the RF signal in the first semiconductor manufacturing process is greater than the detected intensity of the RF signal in the second semiconductor manufacturing process and the FDC system determines that the measured intensity of the RF signal does not exceed the threshold value in the first semiconductor manufacturing process, the sampling rate of the computation device is increased and the threshold value of the FDC system is decreased in the second semiconductor manufacturing process.

2. The fabrication system as claimed in claim 1, wherein the extracted statistical characteristics comprise a maximum intensity of the RF signal, a range of the intensity of the RF signal, and a standard deviation of the intensity of the RF signal.

3. The fabrication system as claimed in claim 1, wherein the RF sensor comprises an RF current sensor which generates an inducting current corresponding to the intensity of the RF signal through electro-magnetic induction.

4. The processing tool as claimed in claim 1, wherein the sampling rate in the second semiconductor manufacturing process is higher than the sampling rate in the first semiconductor manufacturing process, and the threshold value in the second semiconductor manufacturing process is lower than the threshold value in the first semiconductor manufacturing process.

5. The processing tool as claimed in claim 1, wherein the RF signal is transitioned during a transition period between the first and second semiconductor manufacturing process, and no semiconductor manufacturing process is performed during the transition period.

6. The processing tool as claimed in claim 1, wherein the first semiconductor manufacturing process and a second semiconductor manufacturing process are performed on a first integrated circuit (IC), and the processing tool is configured to perform a semiconductor manufacturing process on a second IC with the adjusted RF signal when the detected intensity of the RF signal exceeds the threshold value or the threshold range.

7. The fabrication system as claimed in claim 1, wherein when the detected intensity of the RF signal in the first semiconductor manufacturing process is greater than the detected intensity of the RF signal in the second semiconductor manufacturing process and the FDC system determines that the measured intensity of the RF signal does not exceed the threshold value in the first semiconductor manufacturing process, the sampling rate of the second semiconductor manufacturing process is twice the sampling rate of the first semiconductor manufacturing process.

8. A processing tool, comprising:
an RF signal generator, configured to generate an RF signal, wherein the RF signal generator comprises:
a high-frequency (HF) signal source, configured to generate an HF signal;
a low-frequency (LF) signal source, configured to generate an LF signal; and
a distributed network, arranged between the LF signal source and the HF signal source, configured to combine and distribute the LF signal and the HF signal to generate the RF signal, wherein the LF signal source is separated from the HF signal source by the distributed network;
at least one electrode, configured to receive the RF signal to execute a first semiconductor manufacturing process during a first period and a second semiconductor manufacturing process during a second period, wherein the second period is shorter than the first period; and
a first RF sensor and a second RF sensor, arranged separately from the electrode and the RF signal generator to wirelessly detect intensity of the RF signal, wherein the detected intensity of the RF signal is utilized for extracting statistical characteristics by a computation device with a sampling rate, and the statistical characteristics are transmitted to a fault detection and classification (FDC) system,
wherein the first RF sensor is arranged between the distribution network and the electrode, and the second RF sensor is arranged between the distribution network and the HF signal source,
wherein the FDC system is configured to determine whether or not the detected intensity of the RF signal exceeds a threshold value or is outside a threshold range according to the extracted statistical characteristics,
wherein the first semiconductor process and the second semiconductor process are etching processes,
wherein when the detected intensity of the RF signal during the first period is greater than the detected intensity of the RF signal during the second period and the FDC system determines that the detected intensity of the RF signal does not exceed the threshold value during the first period, the sampling rate of the second period is twice the sampling rate of the first period, and the threshold value of the second period is less than the threshold value of the first period and greater than half the threshold value of the first period.

9. The processing tool as claimed in claim 8, wherein the RF signal generator further comprises:
a matching network, coupled between the distributed network and the HF signal source and configured to decrease reflectiveness of the HF signal for generating the RF signal.

10. The processing tool as claimed in claim 8, wherein the RF signal generator further comprises:
a matching network, coupled between the distributed network and the HF signal source, and configured to decrease reflectiveness of the HF signal for generating the RF signal; and
a tap, coupled between the distributed network and the LF signal source LF, and configured to stabilize frequency of the LF signal,
wherein the first RF sensor is configured to detect the RF signal transmitted from the distribution network to the electrode, and the second RF sensor is configured to detect the HF signal transmitted through the matching network.

11. The processing tool as claimed in claim 8, wherein when the detected intensity of the RF signal exceeds the threshold value or is within the threshold range, the RF signal will be adjusted to meet the threshold value or the threshold range.

12. The processing tool as claimed in claim 8, wherein when the FDC system determines that the detected maximum intensity of the RF signal is greater than the threshold value, the RF signal generator is configured to adjust the RF signal.

13. The processing tool as claimed in claim 8, wherein when the FDC system determines that the detected intensity of the RF signal falls outside the threshold range, the RF signal generator is configured to adjust the RF signal.

14. The processing tool as claimed in claim 8, wherein each of the first and second RF sensors comprises a metal coil and a coaxial connector which is surrounded by the metal coil, the coaxial connector is configured to connect a coaxial cable, and the coaxial cable is configured to connect the first and second RF sensors and the computation device.

15. The processing tool as claimed in claim 8, wherein the extracted statistical characteristics comprise a maximum intensity of the RF signal, a range of the intensity of the RF signal, and a standard deviation of the intensity of the RF signal.

16. An arcing protection method, comprising:
using a distribution network to combine and distribute a low-frequency (LF) signal from a LF signal source and a high-frequency (HF) signal from a HF signal source to generate an RF signal during a first semiconductor manufacturing process and a second semiconductor manufacturing process, wherein the LF signal source is separated from the HF signal source by the distributed network;

detecting an intensity of the RF signal from the distribution network to at least one electrode of a processing tool wirelessly by a first RF sensor, wherein the first RF sensor is apart from the distribution network and the processing tool;

detecting an intensity of the HF signal from the HF signal source to the distribution network wirelessly by a second RF sensor, wherein the second RF sensor is apart from the distribution network and the processing tool;

extracting statistical characteristics with a sampling rate based on the detected intensity of the RF and HF signals signal;

determining whether or not the detected intensity of the RF signal exceeds a threshold value or threshold range according to the extracted statistical characteristics; and adjusting the RF signal when the intensity of the RF signal exceeds the threshold value or the threshold range, wherein when the sampling rate is increased, the threshold value is decreased, wherein the first semiconductor manufacturing process is switched to the second semiconductor manufacturing process by the processing tool during a transition period, and the detected intensity of the RF signal in the transition period is greater than the detected intensity of the RF signal in the first and second semiconductor manufacturing process, wherein the first semiconductor process and the second semiconductor process are etching processes, wherein in response to the detected intensity of the RF signal in the first semiconductor manufacturing process being greater than the detected intensity of the RF signal in the second semiconductor manufacturing process and the intensity of the RF signal that does not exceed the threshold value in the first semiconductor manufacturing process, the sampling rate is increased and the threshold value is decreased in the second semiconductor manufacturing process.

17. The arcing protection method as claimed in claim 16, wherein the extracted statistical characteristics comprise a detected maximum intensity of the RF signal, a range of the intensity of the RF signal, and a standard deviation of the detected intensity of the RF signal.

18. The arcing protection method as claimed in claim 17, wherein determining whether or not the detected intensity of the RF signal exceeds the threshold value or threshold range comprises:

determining whether the detected maximum intensity of the RF signal is greater than the threshold value.

19. The arcing protection method as claimed in claim 17, wherein the determining whether or not the detected intensity of the RF signal exceeds the threshold value or threshold range comprises:

determining whether or not range of the detected intensity of the RF signal falls outside the threshold range.

20. The arcing protection method as claimed in claim 16, wherein each of the first and second RF sensors comprises a metal coil and a coaxial connector which is surrounded by the metal coil.

\* \* \* \* \*